United States Patent
Lin et al.

(10) Patent No.: US 8,643,148 B2
(45) Date of Patent: Feb. 4, 2014

(54) CHIP-ON-WAFER STRUCTURES AND METHODS FOR FORMING THE SAME

(75) Inventors: Jing-Cheng Lin, Hsin-Chu (TW); Hsin Chang, Hsin-Chu (TW); Shih Ting Lin, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 86 days.

(21) Appl. No.: 13/397,204

(22) Filed: Feb. 15, 2012

(65) Prior Publication Data

US 2013/0134559 A1    May 30, 2013

Related U.S. Application Data

(60) Provisional application No. 61/565,346, filed on Nov. 30, 2011.

(51) Int. Cl.
    *H01L 21/78*      (2006.01)
(52) U.S. Cl.
    USPC ............................................................. 257/620
(58) Field of Classification Search
    USPC .................. 257/737, 620, E23.021, E23.033, 257/E21.508, E21.577
    See application file for complete search history.

(56) References Cited

U.S. PATENT DOCUMENTS

| | | | |
|---|---|---|---|
| 4,811,082 A | 3/1989 | Jacobs et al. | |
| 4,990,462 A | 2/1991 | Sliwa, Jr. | |
| 5,075,253 A | 12/1991 | Sliwa, Jr. | |
| 5,380,681 A | 1/1995 | Hsu | |
| 5,481,133 A | 1/1996 | Hsu | |
| 6,002,177 A | 12/1999 | Gaynes et al. | |
| 6,187,678 B1 | 2/2001 | Gaynes et al. | |
| 6,229,216 B1 | 5/2001 | Ma et al. | |
| 6,236,115 B1 | 5/2001 | Gaynes et al. | |
| 6,271,059 B1 | 8/2001 | Bertin et al. | |
| 6,279,815 B1 | 8/2001 | Correia et al. | |
| 6,355,501 B1 | 3/2002 | Fung et al. | |
| 6,434,016 B2 | 8/2002 | Zeng et al. | |
| 6,448,661 B1 | 9/2002 | Kim et al. | |
| 6,461,895 B1 | 10/2002 | Liang et al. | |
| 6,562,653 B1 | 5/2003 | Ma et al. | |
| 6,570,248 B1 | 5/2003 | Ahn et al. | |
| 6,600,222 B1 | 7/2003 | Levardo | |
| 6,603,191 B2 * | 8/2003 | Wakabayashi et al. | 257/620 |
| 6,607,938 B2 | 8/2003 | Kwon et al. | |
| 6,661,085 B2 | 12/2003 | Kellar et al. | |
| 6,762,076 B2 | 7/2004 | Kim et al. | |
| 6,790,748 B2 | 9/2004 | Kim et al. | |
| 6,887,769 B2 | 5/2005 | Kellar et al. | |
| 6,908,565 B2 | 6/2005 | Kim et al. | |
| 6,908,785 B2 | 6/2005 | Kim | |
| 6,924,551 B2 | 8/2005 | Rumer et al. | |

(Continued)

*Primary Examiner* — Thao Le
(74) *Attorney, Agent, or Firm* — Slater & Matsil, L.L.P.

(57) ABSTRACT

A package component includes a substrate, wherein the substrate has a front surface and a back surface over the front surface. A through-via penetrates through the substrate. A conductive feature is disposed over the back surface of the substrate and electrically coupled to the through-via. A first dielectric pattern forms a ring covering edge portions of the conductive feature. An Under-Bump-Metallurgy (UBM) is disposed over and in contact with a center portion of the conductive feature. A polymer contacts a sidewall of the substrate. A second dielectric pattern is disposed over and aligned to the polymer. The first and the second dielectric patterns are formed of a same dielectric material, and are disposed at substantially a same level.

19 Claims, 14 Drawing Sheets

(56) References Cited

U.S. PATENT DOCUMENTS

| | | |
|---|---|---|
| 6,943,067 B2 | 9/2005 | Greenlaw |
| 6,946,384 B2 | 9/2005 | Kloster et al. |
| 6,975,016 B2 | 12/2005 | Kellar et al. |
| 7,037,804 B2 | 5/2006 | Kellar et al. |
| 7,056,807 B2 | 6/2006 | Kellar et al. |
| 7,087,538 B2 | 8/2006 | Staines et al. |
| 7,151,009 B2 | 12/2006 | Kim et al. |
| 7,157,787 B2 | 1/2007 | Kim et al. |
| 7,215,033 B2 | 5/2007 | Lee et al. |
| 7,276,799 B2 | 10/2007 | Lee et al. |
| 7,279,795 B2 | 10/2007 | Periaman et al. |
| 7,307,005 B2 | 12/2007 | Kobrinsky et al. |
| 7,317,256 B2 | 1/2008 | Williams et al. |
| 7,320,928 B2 | 1/2008 | Kloster et al. |
| 7,345,350 B2 | 3/2008 | Sinha |
| 7,402,442 B2 | 7/2008 | Condorelli et al. |
| 7,402,515 B2 | 7/2008 | Arana et al. |
| 7,410,884 B2 | 8/2008 | Ramanathan et al. |
| 7,432,592 B2 | 10/2008 | Shi et al. |
| 7,494,845 B2 | 2/2009 | Hwang et al. |
| 7,528,494 B2 | 5/2009 | Furukawa et al. |
| 7,531,890 B2 | 5/2009 | Kim |
| 7,557,597 B2 | 7/2009 | Anderson et al. |
| 7,576,435 B2 | 8/2009 | Chao |
| 7,834,450 B2 | 11/2010 | Kang |
| 8,399,963 B2 * | 3/2013 | Tsai et al. ............ 257/620 |
| 2009/0302448 A1 * | 12/2009 | Huang ............ 257/686 |
| 2012/0018876 A1 * | 1/2012 | Wu et al. ............ 257/737 |
| 2013/0221493 A1 * | 8/2013 | Kim et al. ............ 257/620 |

* cited by examiner

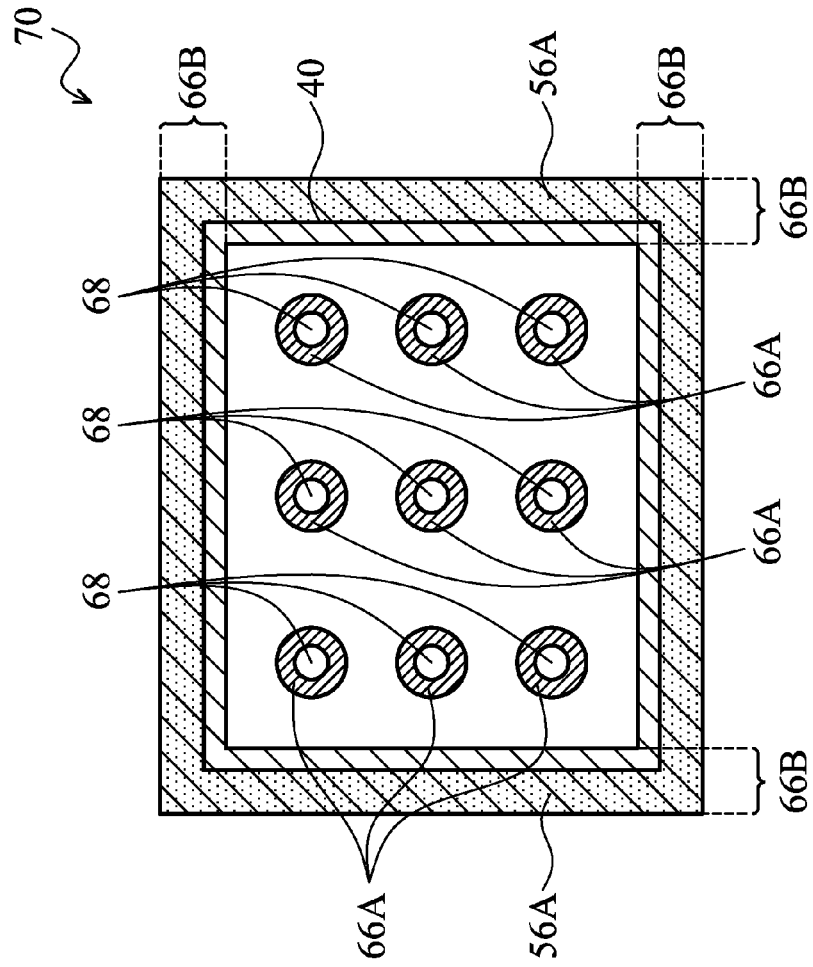

CHIP-ON-WAFER STRUCTURES AND METHODS FOR FORMING THE SAME

This application claims the benefit of the following provisionally filed U.S. Patent Application Ser. No. 61/565,346, filed Nov. 30, 2011, and entitled "Chip-on-Wafer Structures and Methods for Forming the Same;" which application is hereby incorporated herein by reference.

BACKGROUND

In three-dimensional integrated circuit (3DIC) formation processes, device dies may be bonded to a wafer. Typically, after the bonding of the dies onto the wafer, a molding compound is applied to encapsulate the device dies and the wafer. Solder bumps are formed on the wafer to electrically couple to the devices in the wafer. The electrical connection to the devices in the device dies and the devices in the wafer is achieved through Through-Silicon Vias (TSVs).

After the molding compound is applied, a die saw is performed to saw the wafer and the device dies into packages, wherein each of the packages may include one of the device dies and one of the chips in the wafer. The die saw is typically performed using a blade, which cuts through the scribe lines in the wafer. Since the wafer may include low-k dielectric materials, the mechanical stress applied by the blade may cause cracks. The cracks in the low-k dielectric materials may propagate to the chips in the wafer, resulting in the yield loss.

BRIEF DESCRIPTION OF THE DRAWINGS

For a more complete understanding of the embodiments, and the advantages thereof, reference is now made to the following descriptions taken in conjunction with the accompanying drawings, in which:

FIG. 12 illustrates a top view of a package formed using the process in FIGS. 1 through 11B.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

Chip-on-Wafer (CoW) packages and methods for forming the same are provided in accordance with exemplary embodiments. The intermediate stages of forming the CoW packages in accordance with embodiments are illustrated. The variations of the embodiments are discussed. Throughout the various views and illustrative embodiments, like reference numbers are used to designate like elements.

Figure 1:
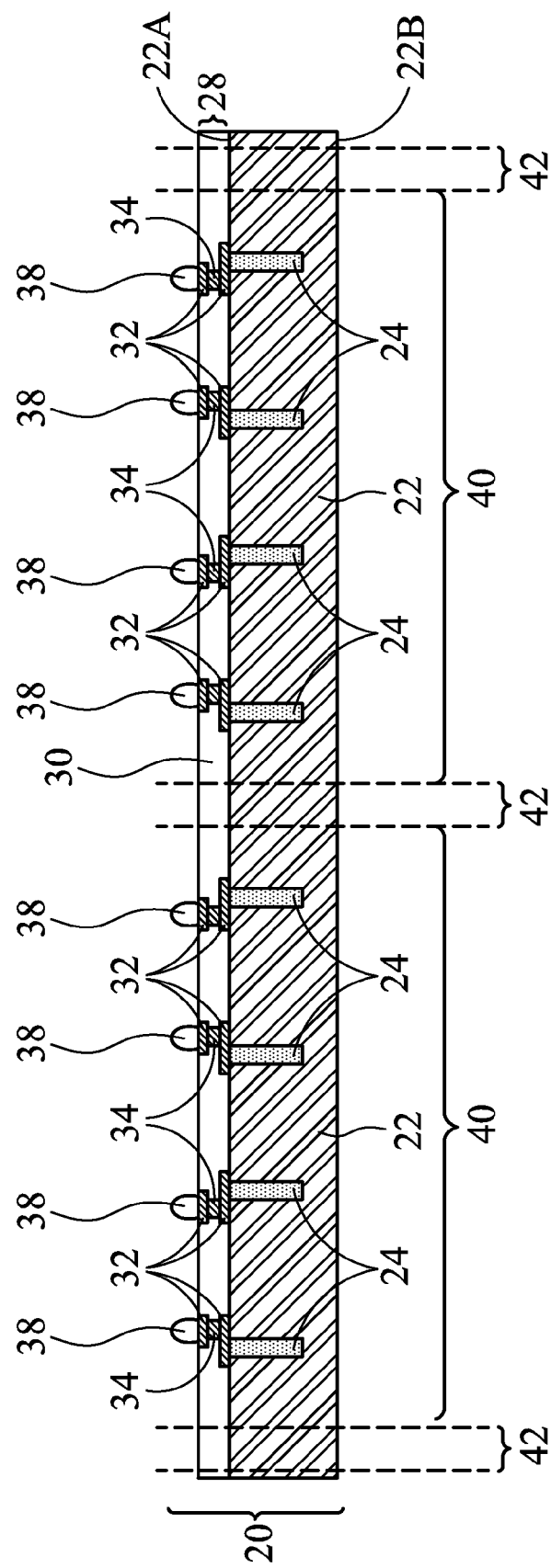
FIGS. 1 through 11B are cross-sectional views of intermediate stages in the manufacturing of a package in accordance with some exemplary embodiments.

FIGS. 1 through 11B are cross-sectional views of intermediate stages in the packaging of integrated circuits in accordance with some exemplary embodiments. FIG. 1 illustrates a cross-sectional view of package component 20, which may be a device wafer, an interposer wafer, or the like. Package component 20 includes substrate 22. In some embodiments, substrate 22 is a semiconductor substrate such as a crystalline silicon substrate. Alternatively, substrate 22 comprises other semiconductor materials such as silicon germanium, silicon carbon, or the like. In alternative embodiments, substrate 22 is a dielectric substrate. Package component 20 may be a device wafer, which includes active devices such as transistors (not shown) formed at surface 22A of semiconductor substrate 22. Throughout the description, surfaces 22A and 22B are referred to as a front surface and a back surface, respectively, of substrate 22. When package component 20 is a device wafer, it may also include passive devices (not shown) such as resistors and/or capacitors. In alternative embodiments, package component 20 is an interposer wafer that does not have active devices therein. In these embodiments, package component 20 may, or may not, include passive devices formed therein.

Through-Substrate Vias (TSVs) 24 may be formed to extend from top surface 22A of substrate 22 into substrate 22. TSVs 24 are also sometimes referred as through-silicon vias when substrate 22 is a silicon substrate. Package component 20 includes a plurality of package components 40, which may be identical to each other. A plurality of scribe lines 42 are located between neighboring package components 40. Package components 40 may be device dies (also known as chips), interposer dies/chips, or the like.

Interconnect structure 28 is formed over substrate 22, and is used to electrically connect to the integrated circuit devices in package component 20 and/or TSVs 24. Interconnect structure 28 may include a plurality of dielectric layers 30. Metal lines 32 are formed in dielectric layers 30. Vias 34 are formed between, and interconnecting, the overlying and underlying metal lines 32. Metal lines 32 and vias 34 are sometimes referred to as Redistribution Lines (RDLs) 32/34. In some embodiments, dielectric layers 30 comprise silicon oxide, silicon nitride, silicon carbide, silicon oxynitride, or combinations thereof. Alternatively, dielectric layers 30 may include one or more low-k dielectric layer having low k values. The k values of the low-k dielectric materials in dielectric layers 30 may be lower than about 3.0, or lower than about 2.5, for example.

Connectors 38 are formed at the top surface of package component 20. In some embodiments, connectors 38 include metal pillars, wherein solder caps may be, or may not be, formed on the top surfaces of the metal pillars. In alternative embodiments, connectors 38 comprise solder regions. In yet other embodiments, connectors 38 may be composite bumps including copper posts, nickel layers, solder caps, and/or the like.

Figure 2:
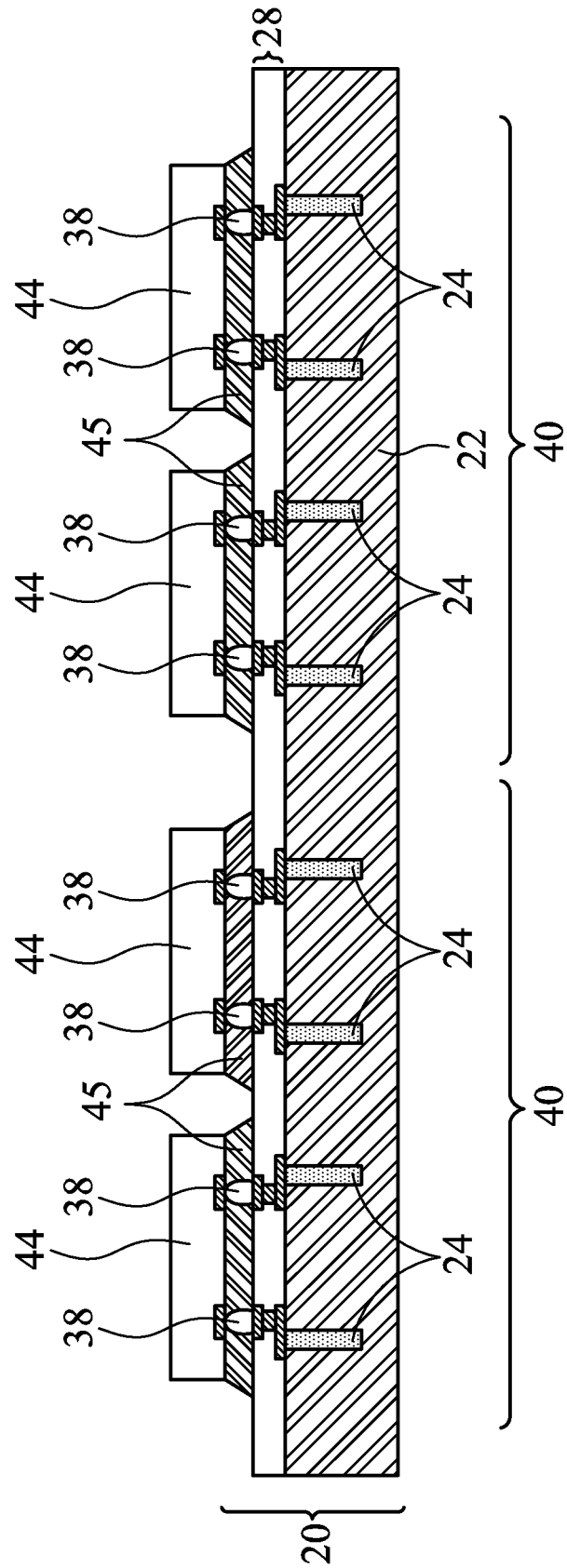

Referring to FIG. 2, package components 44 are bonded to package component 20, for example, through flip-chip bonding. Connectors 38 accordingly electrically couple the circuits in package components 44 to RDLs 32/34 and TSVs 24 in package component 20. Package components 44 may be device dies comprising logic circuits, memory circuits, or the like. Accordingly, package components 44 are alternatively referred to as dies 44 throughout the description. Alternatively, package components 44 may include packages including dies bonded to the respective interposers, package substrates, and/or the like. On each of chips 40, there may be two or more dies 44 bonded thereon.

Next, polymer 45 is dispensed into the space (gaps) between dies 44 and package component 20. Polymer 45 may be an underfill, and hence is referred to as underfill 45 hereinafter, although it may also comprise other polymers such as epoxy. Underfill 45 may also be a molding underfill.

Figure 3:
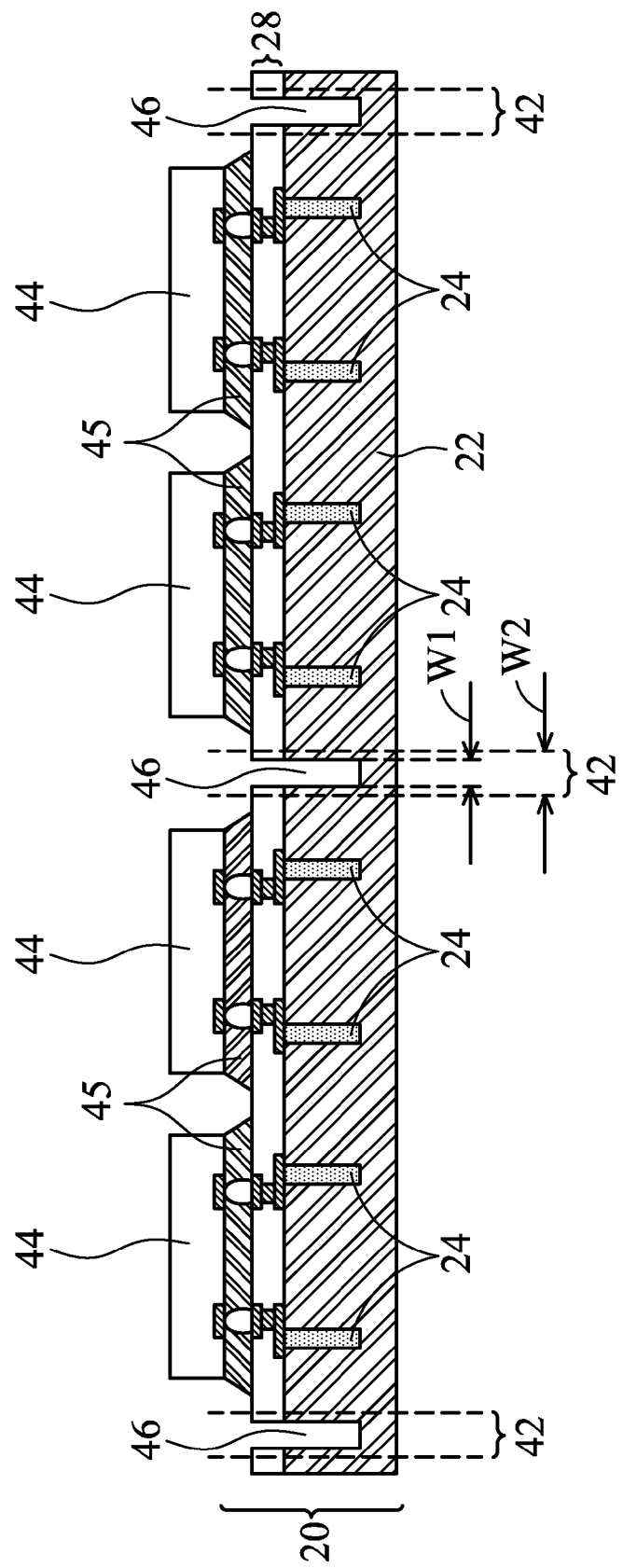

Referring to FIG. 3, a grooving step is performed on package component 20 to form trenches 46. Trenches 46 are located in scribe lines 42. The bottoms of trenches 46 may be substantially level with, or below, the bottom ends of TSVs 24. Width W1 of trenches 46 may be between about 10 μm and about 100 μm, for example. Width W1 of trenches 46 may also be smaller than or substantially equal to width W2 of scribe lines 42.

Figure 4:
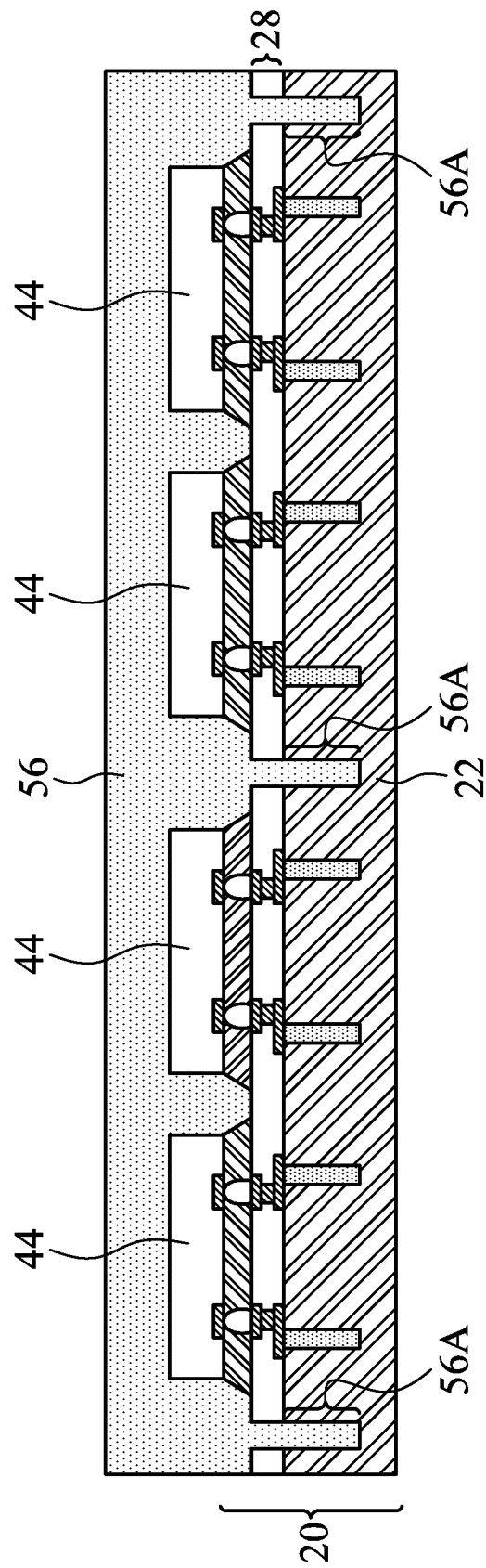
Figure 5:
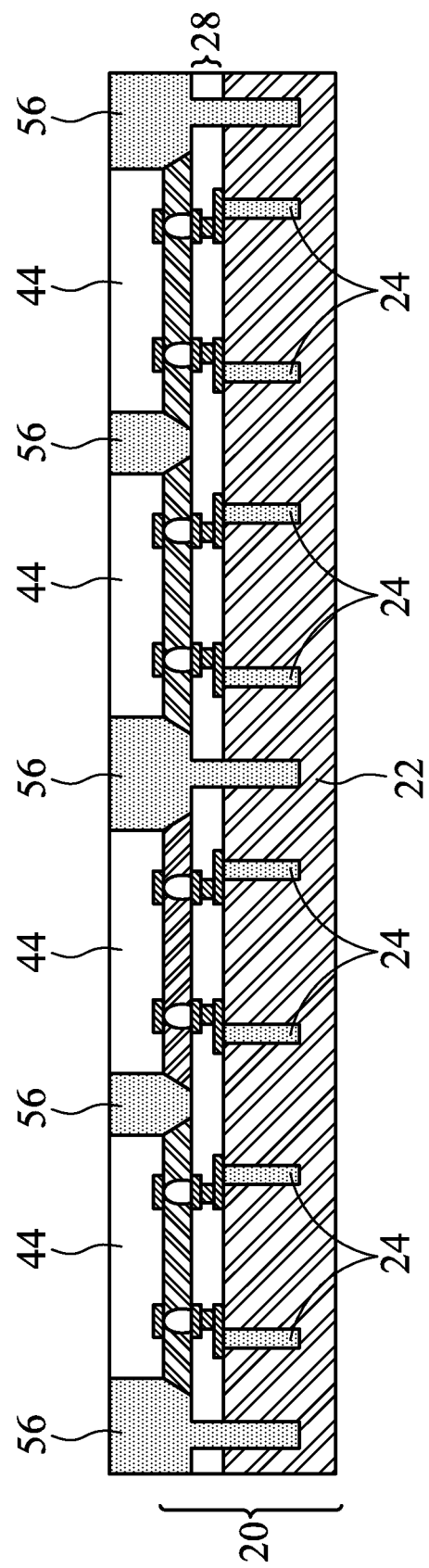
Figure 6:
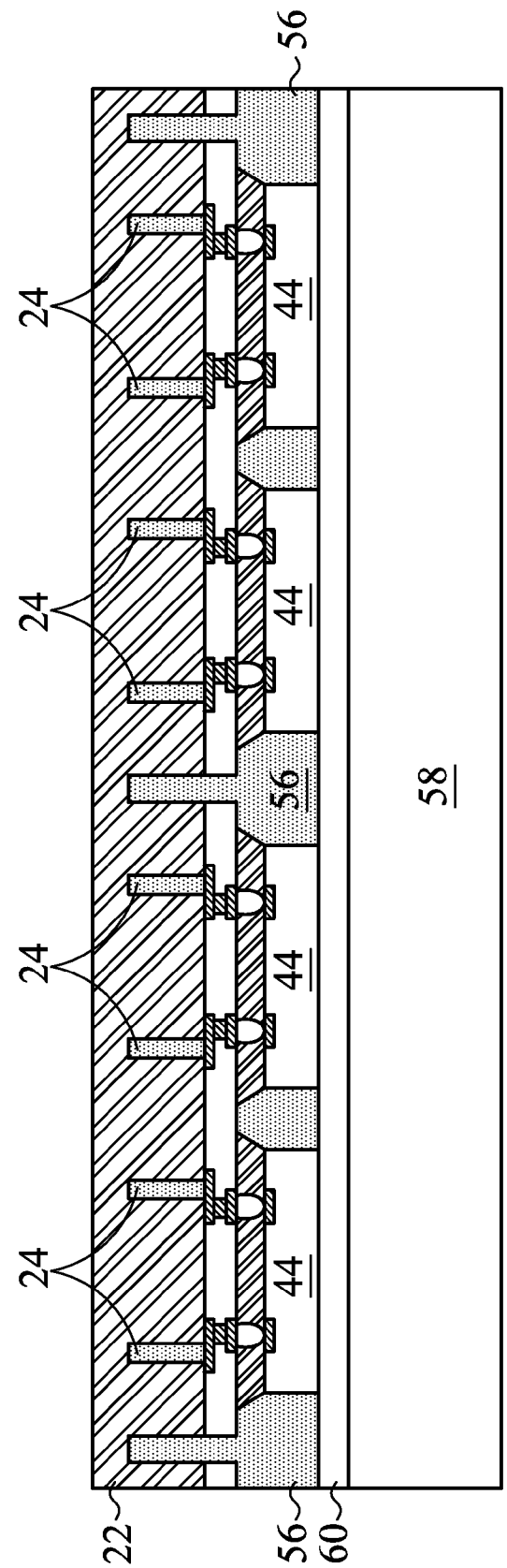

Next, as shown in FIG. 4, polymer 56 is molded on dies 44 and package component 20, for example, using compress molding. In some embodiments, polymer 56 comprises a molding compound, an epoxy, or the like. Polymer 56 may comprise first portions filling into trenches 46 and extending into substrate 22, second portions filling the gaps between neighboring dies 44, and third portions over dies 44. Polymer 56 is then cured. Referring to FIG. 5, in some embodiments, after the curing of polymer 56, a planarization step, such as a grinding step, is performed to level the top surface of polymer 56. The portions of polymer 56 over dies 44 are removed. As a result, the top surfaces of some or all dies 44 are exposed. In alternative embodiments, no planarization step is performed.

FIGS. 6 through 10 illustrate the formation of the backside structure of package component 20. The package structure shown in FIG. 5 is first flipped upside down, and semiconductor substrate 22 faces upwardly. Carrier 58 is then attached to the bottom of the package structure, for example, through adhesive 60. In some exemplary embodiments, carrier 58 is a glass wafer. Adhesive 60 may be an Ultra-Violet (UV) glue in some exemplary embodiments.

Figure 7A:
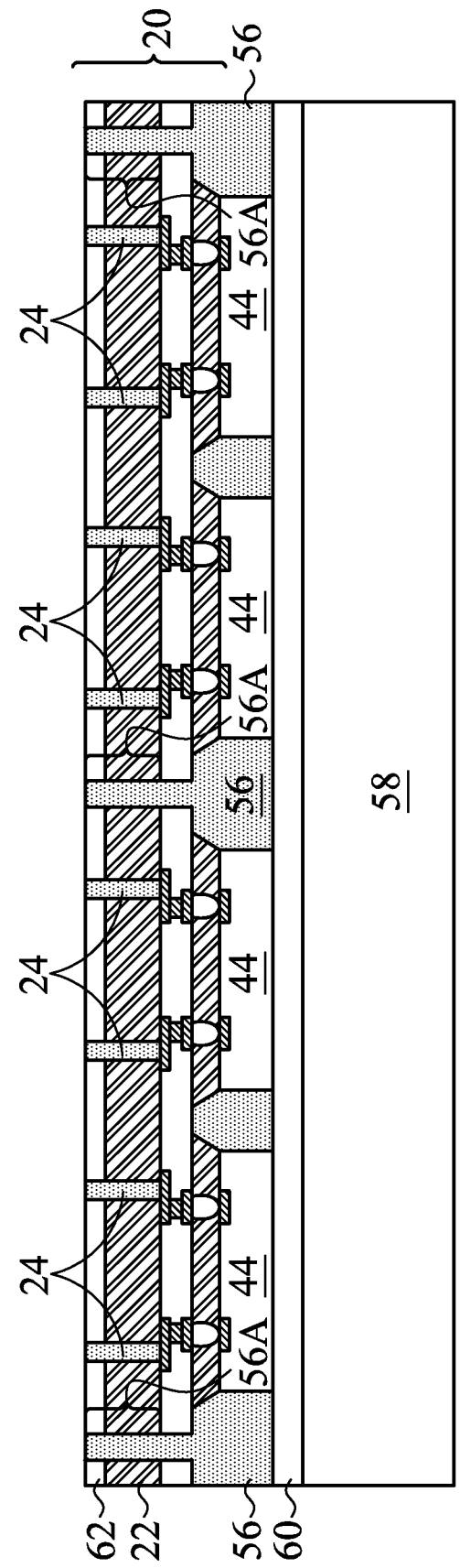
Figure 7B:
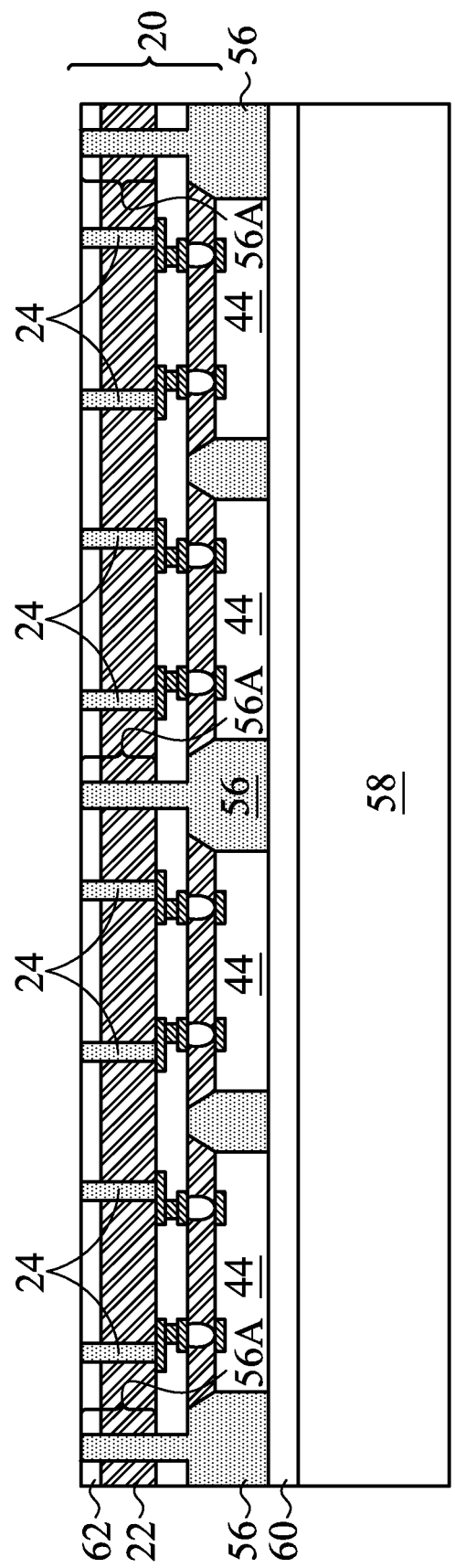

Referring to FIGS. 7A and 7B, a backside grinding is performed on the backside of semiconductor substrate 22 to thin semiconductor substrate 22, until TSVs 24 are exposed. Insulation layer (or insulation layers) 62 is then formed on the backside of semiconductor substrate 22, wherein TSVs 24 extend through insulation layer 62. Insulation layer 62 is formed after thinning semiconductor substrate 22, and a Chemical Mechanical Polish (CMP) process is performed to expose TSVs 24. Insulation layer 62 also acts as an isolation layer to isolate semiconductor substrate 22. The materials of insulation layer 62 may include silicon oxide, silicon nitride, or the like. The formation process for forming insulation layer 62 may include low-temperature deposition processes. In some embodiments, as shown in FIG. 7A, after the formation of insulation layer 62, polymer portions 56A are exposed through insulation layer 62. Alternatively, as shown in FIG. 7B, insulation layer 62 covers polymer portions 56A.

Figure 8:
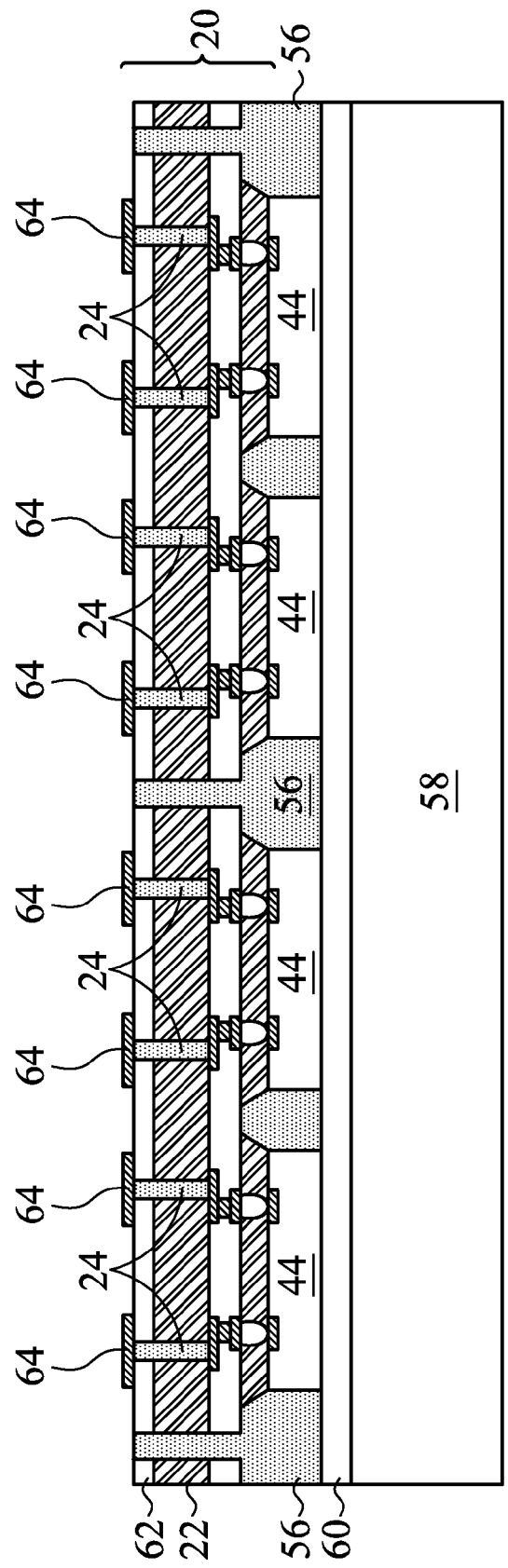

Refer to FIG. 8, conductive features 64 are formed over insulation layer 62 and connected to TSVs 24. Conductive features 64 include Redistribution Lines (RDLs) and conductive pads. In some embodiments, conductive features 64 comprise aluminum, copper, and/or the like. In accordance with some embodiments, the formation of conductive features 64 includes forming a blanket layer, and patterning the blanket layer.

Figure 9:
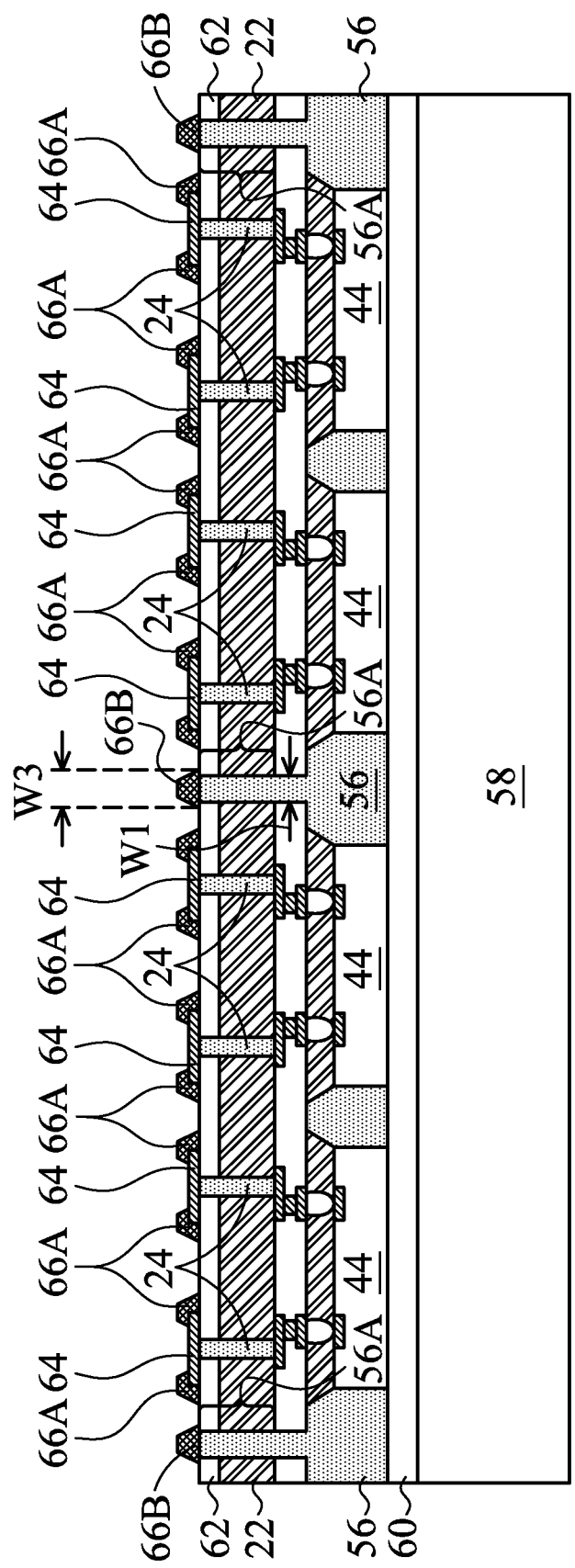

Next, as shown in FIG. 9, dielectric patterns 66A and 66B are formed. Dielectric patterns 66A and 66B may include a polymer such as epoxy, polyimide, benzocyclobutene (BCB), polybenzoxazole (PBO), and the like. Dielectric patterns 66A and 66B may also include photo-sensitive materials (such as PBO or polyimide). Accordingly, the formation of dielectric patterns 66A and 66B may include applying a blanket photo-sensitive material, and exposing and developing the photo-sensitive material. The materials of dielectric patterns 66A and 66B may be relatively soft for absorbing stress. Alternatively, other dielectric materials such as oxides, nitrides, combinations thereof, and multi-layers thereof, may also be used for forming dielectric patterns 66A and 66B. The respective formation process includes low-temperature deposition process(es), so that adhesive 58 is not damaged.

Dielectric patterns 66A may have ring shapes in the top view of the structure shown in FIG. 9. Dielectric patterns 66B include portions that are over and aligned to polymer portions 56A. Furthermore, dielectric patterns 66B may have width W3 greater than width W1 of polymer portions 56A, and may extend beyond the respective edges of polymer portions 56A. Accordingly, dielectric patterns 66B may cover entireties of polymer portions 56A. In the embodiments wherein polymer portions 56A penetrate through insulation layer 62, dielectric patterns 66B are in contact with polymer portions 56A. In alternative embodiments wherein polymer portions 56A are covered by insulation layer 62 (FIG. 7B), dielectric patterns 66B are spaced apart from polymer portions 56A by insulation layer 62. An exemplary top view of dielectric patterns 66A and 66B are illustrated in FIG. 12.

Figure 10:
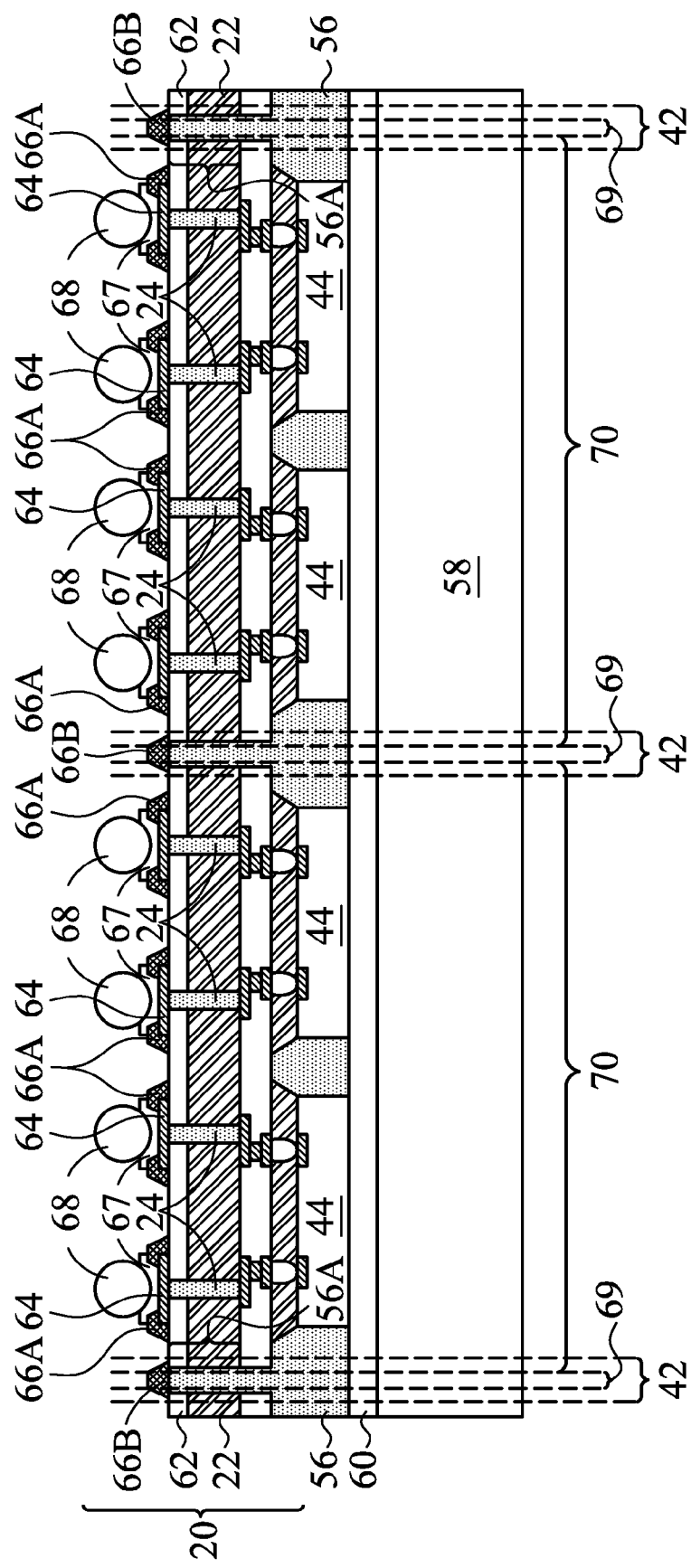

FIG. 10 illustrates the formation of connectors 68, which are electrically coupled to TSVs 24 through the exposed portions of conductive features 64. In some embodiments, connectors 68 are solder balls. In other embodiments, connectors 68 may comprise metal pads, metal bumps, solder caps, or the like. The exemplary formation process may include blanket forming a blanket under-bump-metallurgy (UBM) layer (not shown) using Physical Vapor Deposition (PVD), forming a mask (not shown), wherein the portion of the UBM layer directly over the exposed portions of conductive features 64 are exposed through the mask, while some other portions of the UBM are covered. Connectors 68 are then plated into the openings in the mask. The mask is then removed, and a flash etch is performed to remove the exposed portions of the UBM layer not covered by connectors 68. The remaining portions of the UBM layer are referred to as UBMs 67. In the embodiments wherein connectors 68 comprise solder, a reflow may be performed after the plating. Connectors 68 may be used to bond to an additional electrical component (not shown), which may be a package substrate, a printed circuit board (PCB), or the like.

Figure 11A:
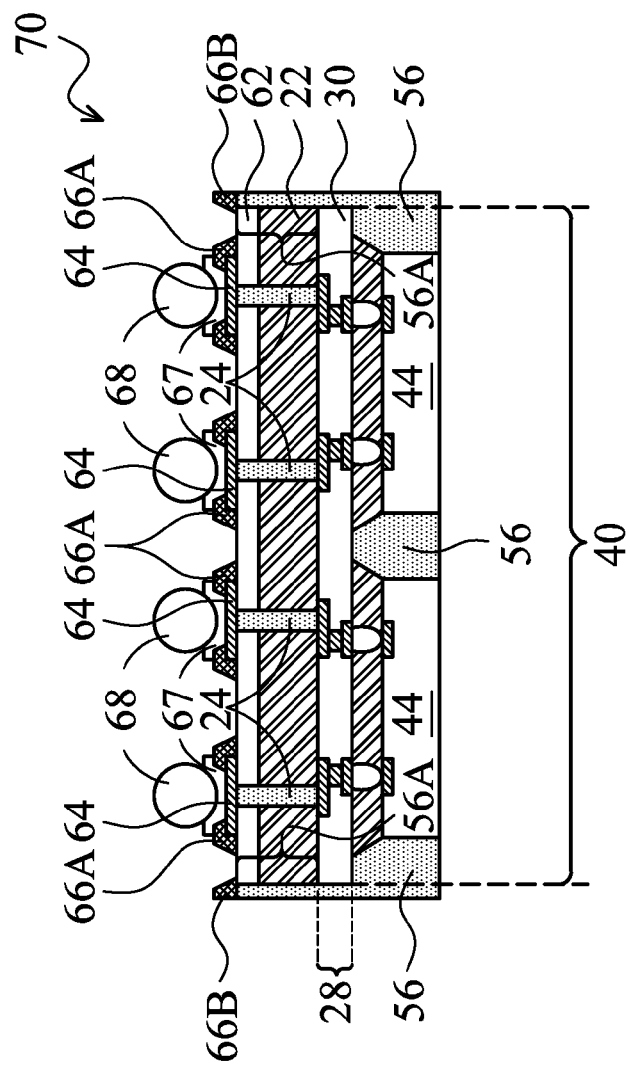
Figure 11B:
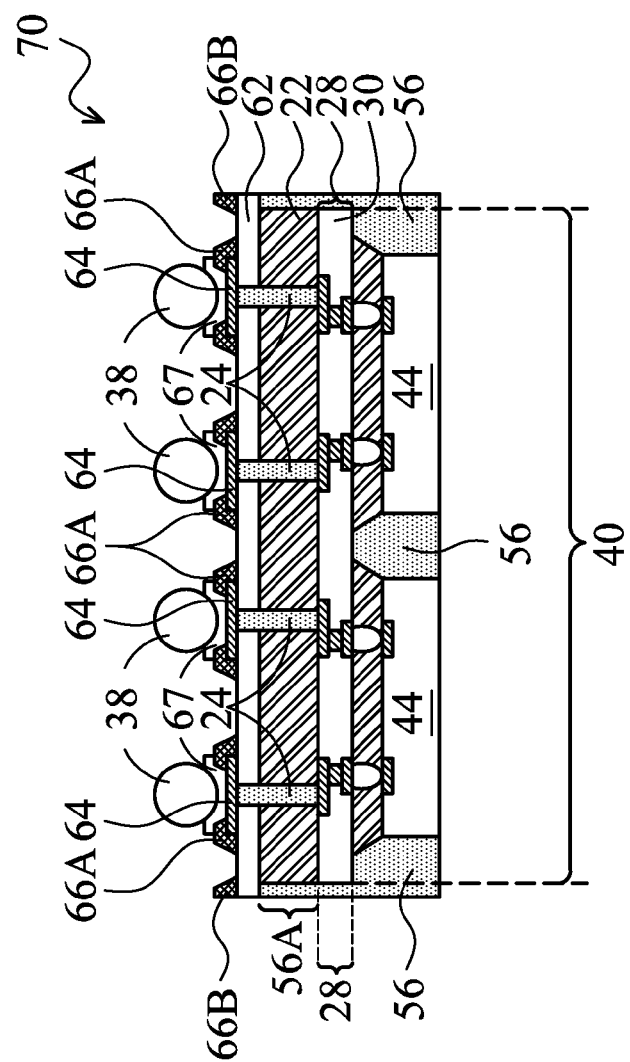

A die sawing is then performed to saw apart packages 70 from the package structure shown in FIG. 10. The sawing is performed along scribe lines 42. The kerf lines 69 may be in the middle of polymer portions 56A (FIG. 10). The resulting packages 70 are shown in FIGS. 11A and 11B. Each of packages 70 includes one of dies 40 and one or more of dies 44. After the sawing, as shown in FIGS. 11A and 11B, some polymer portions 56A remain on the sidewalls of substrate 22 and the sidewalls of dielectric layers 30. Dielectric patterns 66B also have remaining portions over and aligned to polymer portions 56A, wherein the outer edges of dielectric patterns 66B are aligned to the corresponding outer edges of polymer portions 56A. In FIG. 11A, dielectric patterns 66B contact the top surfaces of polymer portions 56A. In FIG. 11B, dielectric patterns 66B are spaced from polymer portions 56A by insulation layer 62.

FIG. 12 illustrates a top view of package 70. Dielectric pattern 66B forms a ring that extends to the edges of package 70. The edges of dielectric pattern 66B are aligned to the edges of polymer portion 56A, which also forms a ring encircling and contacting chip 40 (please refer to FIG. 1). Dielectric pattern 66B, in addition to covering the entirety of polymer portion 56A, may also extend slightly beyond polymer portion 56A in the direction toward the center of package 70. Dielectric patterns 66A may form a plurality of rings that is separated from each other, and separated from dielectric pattern 66B. Each of dielectric patterns 66A may form a ring covering edge portions of the respective underlying conductive features 64.

In the embodiments, dielectric pattern 66B (FIG. 10) covers polymer portions 56A. Accordingly, in the packaging process, for example, in the deposition process for forming UBM 67 as in FIG. 10, dielectric patterns 66B prevents the out-gassing from polymer portion 56A. The undesirable redeposition during the formation of UBMs 67 is thus reduced.

In accordance with embodiments, a package component includes a substrate, wherein the substrate has a front surface and a back surface over the front surface. A through-via penetrates through the substrate. A conductive feature is disposed over the back surface of the substrate and electrically coupled to the through-via. A first dielectric pattern forms a ring covering edge portions of the conductive feature. A Under-Bump-Metallurgy (UBM) is disposed over and in contact with a center portion of the conductive feature. A polymer contacts a sidewall of the substrate. A second dielectric pattern is disposed over and aligned to the polymer. The first and the second dielectric patterns are formed of a same dielectric material, and are disposed at substantially a same level.

In accordance with other embodiments, a wafer includes a plurality of chips including a plurality of through-substrate vias penetrating through a semiconductor substrate of the wafer, and a plurality of scribe lines separating the plurality of chips from each other. A plurality of dies is underlying and bonded to a front side of the wafer. A first polymer region includes first portions in the plurality of scribe lines, wherein the first portions penetrate through the wafer and contact sidewalls of the semiconductor substrate. The first polymer region further includes second portions at a same level as, and encircling, the plurality of dies. A plurality of conductive features is disposed on a back side of the semiconductor substrate and electrically coupled to the plurality of through-substrate vias. A second polymer layer includes first portions covering edge portions of the plurality conductive features, and second portions over and aligned to the first portions of the first polymer region.

In accordance with yet other embodiments, a method includes forming trenches in scribe lines of a wafer, wherein the trenches extend from a front surface of the wafer into a substrate of the wafer. A first polymer is filled into the trenches. The substrate is thinned from the backside, wherein the first polymer and through-vias in the substrate are exposed after the step of thinning. Conductive features are formed on the backside of the wafer and electrically coupled to the through-vias. A second polymer layer is formed on the backside of the wafer and covering the conductive features. The second polymer layer is then patterned. The remaining portions of the patterned second polymer layer include first portions covering edge portions of the conductive features, and second portions aligned to portions of the first polymer in the trenches.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
    a package component comprising a substrate, wherein the substrate comprises a front surface, and a back surface over the front surface;
    a through-via penetrating through the substrate;
    a conductive feature over the back surface of the substrate and electrically coupled to the through-via;
    a first dielectric pattern forming a ring covering edge portions of the conductive feature;
    a Under-Bump-Metallurgy (UBM) over and in contact with a center portion of the conductive feature;
    a polymer contacting a sidewall of the substrate; and
    a second dielectric pattern over and aligned to the polymer, wherein the first and the second dielectric patterns are formed of a same dielectric material, and are disposed at substantially a same level.

2. The device of claim 1, wherein the first and the second dielectric patterns comprise an additional polymer.

3. The device of claim 1, wherein the first and the second dielectric patterns comprise a photo sensitive material.

4. The device of claim 1 further comprising a die bonded to a front side of the package component, wherein the polymer further encircles the die, and contacts sidewalls of the die.

5. The device of claim 1 being a discrete package, wherein the polymer forms a first ring encircling the substrate and contacting sidewalls of the substrate, wherein the second dielectric pattern forms a second ring over and aligned to the first ring, and wherein the first ring and the second ring have outer edges aligned to each other.

6. The device of claim 1, wherein the first and the second dielectric patterns are disconnected from each other.

7. The device of claim 1, wherein the second dielectric pattern is in contact with the polymer.

8. A device comprising:
    a wafer comprising:
        a plurality of chips comprising a plurality of through-substrate vias penetrating through a semiconductor substrate of the wafer; and
        a plurality of scribe lines separating the plurality of chips from each other;
    a plurality of dies underlying and bonded to a front side of the wafer;
    a first polymer region comprising:
        first portions in the plurality of scribe lines, penetrating through the wafer, and contacting sidewalls of the semiconductor substrate; and
        second portions at a same level as, and encircling, the plurality of dies;
    a plurality of conductive features on a back side of the semiconductor substrate and electrically coupled to the plurality of through-substrate vias; and
    a second polymer layer comprising:
        first portions covering edge portions of the plurality conductive features; and
        second portions over and aligned to the first portions of the first polymer region.

9. The device of claim 8 further comprising:
    a plurality of Under-Bump-Metallurgy (UBMs) over and in contact with center portions of the plurality of conductive features; and
    a plurality of connectors over and aligned to the plurality of UBMs.

10. The device of claim 8, wherein the first polymer region comprises a molding compound, and the second polymer layer comprises a photo-sensitive material.

11. The device of claim 8, wherein the first portions and the second portions of the second polymer layer are disconnected from each other, and wherein the first portions of the second polymer layer form rings.

12. The device of claim 8, wherein the second portions of the second polymer layer are in contact with the first portions of the first polymer region.

13. The device of claim 8 further comprising an insulation layer contacting a back surface of the semiconductor substrate, wherein the second portions of the second polymer layer are spaced apart from the first portions of the first polymer region by the insulation layer.

14. A device comprising:
   a package component comprising a substrate, wherein the substrate comprises a front surface, and a back surface over the front surface;
   a through-via penetrating through the substrate;
   a die underlying and bonded to a front side of the package component;
   a polymer encircling, and in contact with, sidewalls of the substrate and sidewalls of the die, wherein the polymer comprises a bottom surface level with a surface of the die, and a top surface level with or higher than the back surface of the substrate; and
   an insulation layer over the substrate, wherein the insulation layer comprises a bottom surface contacting the back surface of the substrate and a top surface of the polymer, and wherein the through-via penetrates through the insulation layer.

15. The device of claim 14, wherein the top surface of the polymer is coplanar with the back surface of the substrate.

16. The device of claim 14, wherein the top surface of the polymer is higher than the back surface of the substrate.

17. The device of claim 14, further comprising:
   a conductive feature over the back surface of the substrate and electrically coupled to the through-via;
   a first dielectric pattern forming a ring covering edge portions of the conductive feature;
   a Under-Bump-Metallurgy (UBM) over and in contact with a center portion of the conductive feature; and
   a second dielectric pattern over and aligned to the polymer, wherein the first dielectric pattern and the second dielectric pattern are separated from each other, and wherein the first and the second dielectric patterns are formed of the same dielectric material.

18. The device of claim 17, wherein the first and the second dielectric patterns comprise a polymer.

19. The device of claim 17, wherein the first and the second dielectric patterns comprise a photo sensitive material.

* * * * *

UNITED STATES PATENT AND TRADEMARK OFFICE
CERTIFICATE OF CORRECTION

PATENT NO.           : 8,643,148 B2                                        Page 1 of 1
APPLICATION NO.      : 13/397204
DATED                : February 4, 2014
INVENTOR(S)          : Jing-Cheng Lin et al.

It is certified that error appears in the above-identified patent and that said Letters Patent is hereby corrected as shown below:

In the Claims

In Col. 8, line 22, claim 17, delete "the" and insert --a--.

Signed and Sealed this
Eighth Day of April, 2014

Michelle K. Lee
*Deputy Director of the United States Patent and Trademark Office*